United States Patent
Dingfelder et al.

(10) Patent No.: US 7,307,856 B2
(45) Date of Patent: Dec. 11, 2007

(54) APPARATUS FOR TOOL-LESS REMOVAL OF PCB ASSEMBLY

(75) Inventors: Donald Wayne Dingfelder, Winona, MN (US); James Dorance Gerken, Zumbro Falls, MN (US); Scott Raymond LaPree, Rochester, MN (US); Gregory Todd Smith, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 140 days.

(21) Appl. No.: 11/335,764

(22) Filed: Jan. 19, 2006

(65) Prior Publication Data

US 2007/0163108 A1  Jul. 19, 2007

(51) Int. Cl.
*H05K 7/14* (2006.01)
(52) U.S. Cl. .................. 361/801; 361/726; 361/759
(58) Field of Classification Search .......... 361/801, 361/726, 732, 740, 747, 752, 755, 759; 439/476.1; 411/41.17
See application file for complete search history.

(56) References Cited

U.S. PATENT DOCUMENTS 5,384,442 A * 1/1995 Danner ................. 200/566
2005/0231924 A1 * 10/2005 Shih ..................... 361/759
2006/0050202 A1 * 3/2006 Park et al. .............. 349/70
2006/0133059 A1 * 6/2006 Dean et al. ............. 361/801
2007/0076399 A1 * 4/2007 Barina et al. ........... 361/801
2007/0115646 A1 * 5/2007 Wu et al. ............... 361/747

* cited by examiner

*Primary Examiner*—Dean A. Reichard
*Assistant Examiner*—Yurly Semenenko
(74) *Attorney, Agent, or Firm*—Joan Pennington

(57) ABSTRACT

Apparatus for removing a printed circuit board (PCB) and bezel assembly from a unit includes a pull spring is attached to opposing sides of the PCB and bezel assembly. Each pull spring includes a generally M-shaped spring. A first end of the M-shaped spring includes a first pin carrying a knob. The first pin extends through an opening in the bezel and the knob is disposed within a recessed portion of the bezel and is generally flush with a front face of the bezel with the M-shaped spring compressed in a normal constrained position. In an extended position when the M-shaped springs return to a substantially uncompressed state, the knobs are pushed forward and are spaced apart in front of the bezel, enabling a person to grip and pull each knob to remove the PCB and bezel assembly from the unit in which it is installed.

14 Claims, 2 Drawing Sheets

APPARATUS FOR TOOL-LESS REMOVAL OF PCB ASSEMBLY

FIELD OF THE INVENTION

The present invention relates generally to the data processing field, and more particularly, relates to apparatus for removing a printed circuit board (PCB) and bezel assembly from card guides, without requiring the use of tools.

DESCRIPTION OF THE RELATED ART

A need exists for an effective mechanism that allows a user removing a printed circuit board (PCB) and bezel assembly from card guides, particularly with limited available space and restricted access around the bezel.

A mechanism facilitating removal of the PCB and bezel assembly is needed for applications requiring the PCB bezels to be nearly surface to surface, one above the next, so there is substantially no space available above and below the bezels by which to enable using fingers to grasp the bezel to remove the assembly. Also such mechanism facilitating removal of the PCB and bezel assembly is needed for applications where the sides of the bezels cannot be used to remove the assemblies with fingers because the sheet metal cage and outer cover restrict access.

Such mechanism facilitating removal of the PCB and bezel assembly is needed where only front access is permitted to the enclosure in which the PCB and bezel assemblies are inserted. Further some applications require that the mechanism facilitating removal of the PCB and bezel assembly must be concealed behind a cover, which fits tightly, flush against the bezels, so that nothing may protrude from the front of the enclosure.

A tool-less design is required because the PCB/bezel assemblies are Customer Replaceable Units (CRUs). It is desirable also that the mechanism be generally inexpensive.

SUMMARY OF THE INVENTION

A principal aspect of the present invention is to provide apparatus for removing a printed circuit board (PCB) and bezel assembly from card guides in a rack, frame, or the like unit. Other important aspects of the present invention are to provide such apparatus for removing a printed circuit board (PCB) and bezel assembly substantially without negative effect and that overcome many of the disadvantages of prior art arrangements.

In brief, apparatus is provided for removing a printed circuit board (PCB) and bezel assembly from a unit. A pull spring is attached to opposing sides of the PCB and bezel assembly. Each pull spring includes a generally M-shaped spring. A first end of the M-shaped spring includes a first pin carrying a knob. A second end of the M-shaped spring includes a second pin for mounting engagement of the pull spring with the PCB and bezel assembly. The first pin extends through an opening in the bezel and the knob is disposed within the bezel opening generally flush with a front face of the bezel with the M-shaped spring compressed in a constrained position. In an extended position provided when the M-shaped springs return to a substantially uncompressed state, the knobs are pushed forward and are spaced apart in front of the bezel, enabling a person to grip and pull each knob to remove the PCB and bezel assembly from the unit in which it is installed.

In accordance with features of the invention, the pull spring is provided in the constrained position with a cover is closed holding the PCB and bezel assembly in the unit. When the cover is removed, the M-shaped springs return to a substantially uncompressed state, the knobs are pushed forward in the extended position. The first end of the M-shaped spring engages a stop surface of the bezel when the M-shaped springs are uncompressed in the extended position.

In accordance with features of the invention, the pull spring is formed of an electrically nonconductive material, such as a plastic material, that retains spring action while being compressed for an extended period of time, such as for several months. For example, the pull spring is formed of an unreinforced, flame retarded Polypropylene material with a melt flow of 3-5 g per 10 minutes.

In accordance with features of the invention, the pull spring is an integral unit or a unitary member. The pull spring is formed, for example, by injection molding technique.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a user is enabled to eject a PCB from a card edge connector on a backplane, and to remove the PCB and bezel assembly from the card guides in which the assembly is inserted without requiring tools. The apparatus of the invention enables the PCB and bezel assembly to be used for applications requiring the PCB bezels to be nearly surface-to-surface, one above the next, so there is substantially no space available above and below the bezels by which to use fingers to grasp the bezel to remove the assembly. The sides of the bezels are not used to remove the assemblies because sheet metal cage and outer cover restrict access. The apparatus of the invention enables tool-less removal that is required when the PCB/bezel assemblies are Customer Replaceable Units (CRUs). The apparatus of the invention enables the PCB and bezel assembly to be used for applications permitting only front access to the enclosure in which the PCB and bezel assemblies are inserted. The apparatus of the invention may be concealed behind a cover, which fits tightly, flush against the bezels. None of the apparatus of the invention may protrude from the front of the enclosure. The apparatus of the invention used to facilitate removal of the PCB and bezel assembly also is generally inexpensive.

In accordance with features of the invention, the apparatus includes two pull springs that are provided with each PCB and bezel assembly, one on each side. When the cover is closed it holds the PCB and bezel assemblies in place. The pull springs are pushed through openings in the bezels by which they are constrained, and the springs are compressed. The knob on the end of each pull spring moves to a point where it is flush within a recessed portion in the bezel, concealing the knobs behind the cover. When the cover is opened, the spring forces the pull springs forward and the knob on each side of the bezel becomes available, such that a person may grip each knob, pull the knobs forward or toward the user, and remove the PCB and bezel assembly from the unit in which it is installed.

Figure 1:
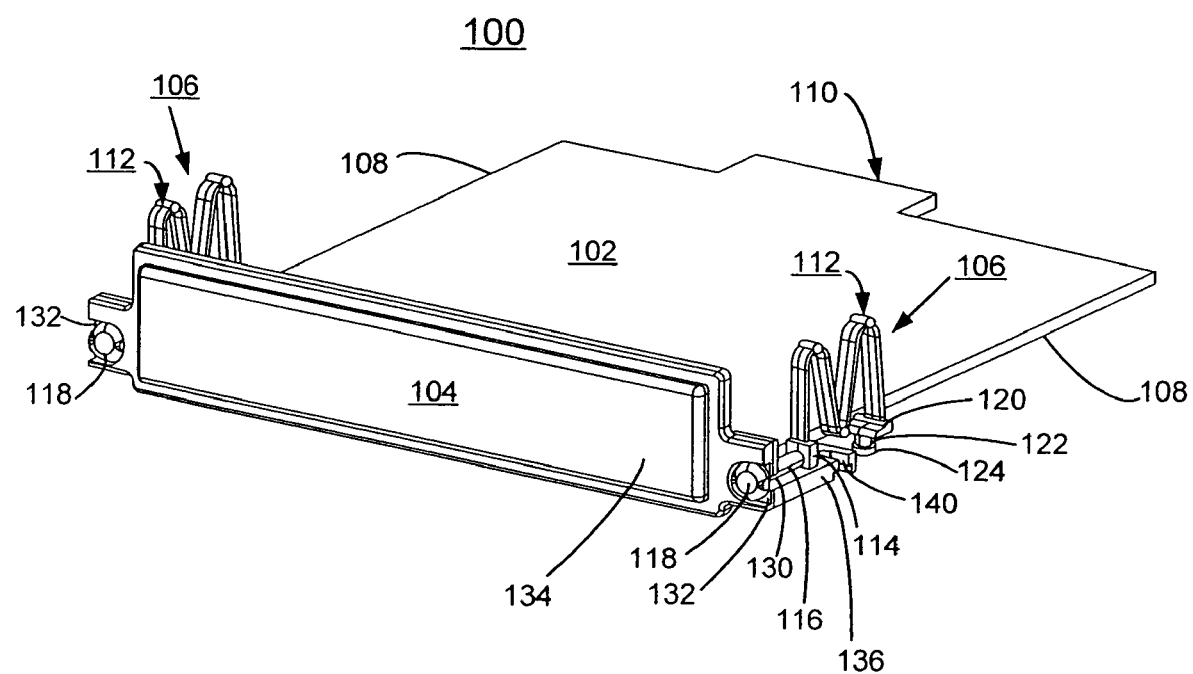
FIG. 1 is a perspective view not to scale illustrating apparatus for removing a PCB and bezel assembly from a unit with the PCB and bezel assembly installed within the unit in accordance with the preferred embodiment.
Figure 2:
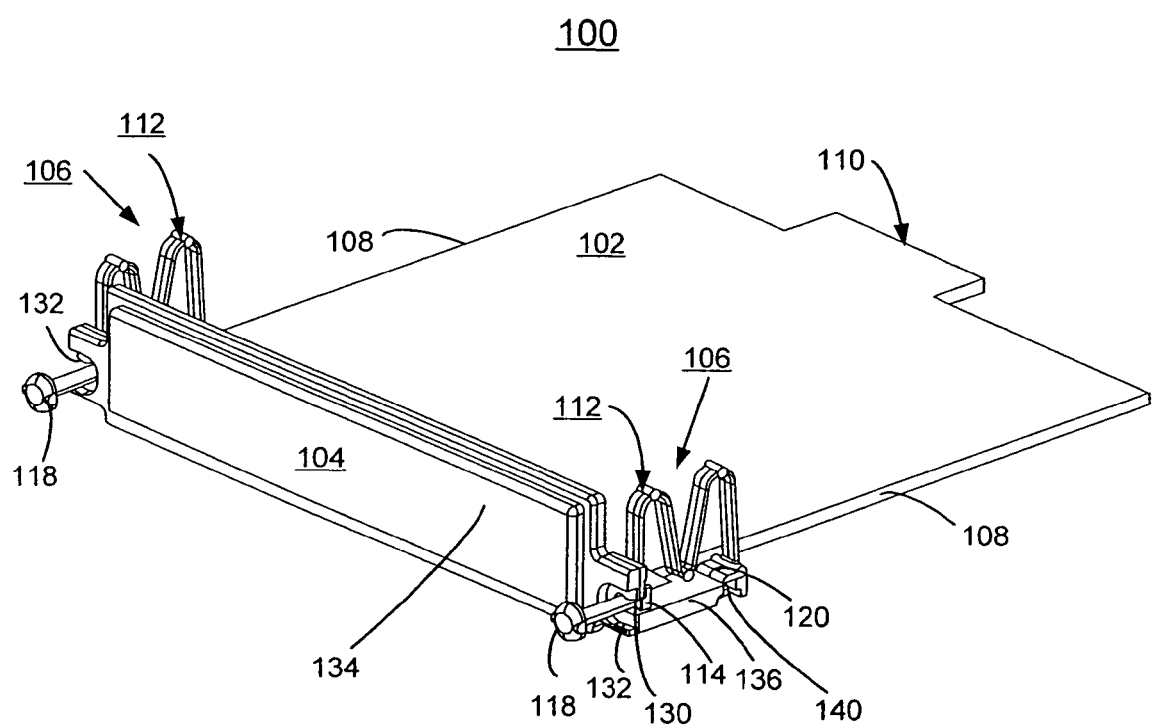
FIG. 2 is a perspective view not to scale illustrating apparatus of FIG. 1 in an extended position for removing the printed circuit board (PCB) and bezel assembly from the unit in accordance with the preferred embodiment.

Having reference now to the drawings, in FIGS. 1 and 2, there is shown apparatus generally designated by the reference character 100 in accordance with the preferred embodiment for removing a printed circuit board (PCB) and bezel assembly from a unit (not shown) receiving multiple closely spaced assemblies.

Apparatus 100 is shown with a printed circuit board (PCB) 102 assembled with a bezel 104. A respective pull spring generally designated by the reference character 106 is attached to opposing sides 108 of the assembly of PCB 102 and bezel 104. A second end 110 of the PCB 102 or backplane 102 opposite the bezel 104 includes electrical connections, for example, provided by a card edge connector (not shown).

Each pull spring 106 includes an M-shaped spring generally designated by the reference character 112. A first end 114 of the M-shaped spring 112 includes a first pin 116 carrying a knob 118. A second end 120 of the M-shaped spring 110 includes a mounting pin 122 with an enlarged flanged end 124 for attaching the pull spring 106 to the PCB and bezel assembly.

Referring to FIG. 1, there is generally shown a constrained position of apparatus 100. The pull springs 106 are provided in the constrained position when a cover is closed, and the cover typically holds multiple closely spaced assemblies of PCB 102 and bezel 104 in unit. In the constrained position the first pin 116 extends through an opening 130 in the bezel 104 with the knob 118 disposed within a recessed portion 132 surrounding the bezel opening 130 generally flush with a front face 134 of the bezel. The first pin 116 is slideably received through the bezel opening 130. In the constrained position the M-shaped springs 112 are compressed when a cover (not shown) is closed holding the PCB 102 and bezel 104 assembly in the receiving unit.

Referring to FIG. 2, there is shown an extended position of apparatus 100. When the cover is removed, the M-shaped springs 112 return to a substantially uncompressed state, the knobs 118 are pushed forward in the extended position. The first end 114 of the M-shaped spring 112 engages a stop surface of the bezel 104 when the M-shaped springs are uncompressed in the extended position.

In the extended position the knob 118 is disposed spaced apart in front of the bezel 104 when the M-shaped spring 112 is released and returns to a generally uncompressed state, for example, when the cover is removed from the unit. In the extended position the knob 118 of the pull spring 106 functions as a handle for a user. The second end 120 of the M-shaped spring 112 engages an inwardly extending ledge 136 of the bezel 104 at a mounting location 140 with the second pin 122 received within the mounting location or slot 140.

In FIG. 1, the second end 120 and rear cylinder of the M-shaped spring 112 is shown back beyond the mounting location 140 within ledge 136 of the bezel 104 with the pull spring 106 modeled in an uncompressed state. As shown in FIG. 1 portions of the pull spring 106 including the second end 120, second pin 122 and enlarged flange 124 are shown. It should be understood that in the normally compressed state in the constrained position of apparatus 100 when the knobs 118 are pressed against the bezel 104 within recesses 132, the M-shaped springs 112 of pull springs 106 are taller and narrower than in the uncompressed state in the extended position of FIG. 2.

In operation of the pull springs 106, for both the compressed state of M-shaped spring 112 in the constrained position of FIG. 1, and the uncompressed state of M-shaped spring 112 in the extended position of FIG. 2, the second pin 122 is received within the mounting location or slot 140, retained and positioned with the enlarged flange 124 disposed below the slot 140 in the bezel ledge 136. The location of the second end 120 of the pull springs 106 is fixed by this mounting engagement of the pull spring with the bezel 104.

In the extended position of FIG. 2 the M-shaped springs 112 spring to the substantially uncompressed state, pushing the knobs 118 forward. Then the knobs 118 are spaced apart in front of the bezel 104, providing easy access for a user to grasp and pull the knobs 118 to remove the assembly PCB 102 and bezel 104 from the unit in which it is installed.

The pull spring 106 is formed of an electrically nonconductive material, such as a plastic material, that retains spring action while being compressed for an extended period of time, such as for several months. For example, the pull spring is formed of an unreinforced, flame retarded Polypropylene material with a melt flow of 3-5 g per 10 minutes.

The pull spring 106 is an integral unit or a unitary member. The pull spring 106 is formed, for example, by injection molding technique.

While the present invention has been described with reference to the details of the embodiments of the invention shown in the drawing, these details are not intended to limit the scope of the invention as claimed in the appended claims.

What is claimed is:

1. An apparatus for removing a printed circuit board (PCB) and bezel assembly from a unit comprising:
   a pair of pull springs; said pull springs being attached to opposing sides of the PCB and bezel assembly;
   each said pull spring including a generally M-shaped spring;
   said M-shaped spring including a first end with a first pin extending through the bezel and carrying a knob in front of the bezel; and a second end of the M-shaped spring being attached with the PCB and bezel assembly;
   in a constrained position, said first pin extending through an opening in the bezel and said knob being disposed within the bezel recessed portion and said M-shaped spring compressed;
   in an extended position, said M-shaped springs returning to a substantially uncompressed state, said knobs being pushed forward, spaced apart in front of the bezel, enabling a user access to each knob to remove the PCB and bezel assembly.

2. The apparatus for removing a printed circuit board (PCB) and bezel assembly from a unit as recited in claim 1 wherein said knob extends generally flush with a front face of the bezel with the M-shaped spring compressed in the constrained position.

3. The apparatus for removing a printed circuit board (PCB) and bezel assembly from a unit as recited in claim 1 wherein said pull springs are provided in the constrained position when a cover is closed for holding the PCB and bezel assembly in the unit.

4. The apparatus for removing a printed circuit board (PCB) and bezel assembly from a unit as recited in claim 1 wherein said pull springs are provided in the extended position when a cover is the cover is removed, said M-shaped springs springing to the substantially uncompressed state pushing the knobs forward in the extended position.

5. The apparatus for removing a printed circuit board (PCB) and bezel assembly from a unit as recited in claim 1 wherein a first end portion of the M-shaped spring engages a stop surface of the bezel when the M-shaped springs are uncompressed in the extended position.

6. The apparatus for removing a printed circuit board (PCB) and bezel assembly from a unit assembly as recited in claim 1 wherein said pull spring is formed of an electrically nonconductive material.

7. The apparatus for removing a printed circuit board (PCB) and bezel assembly from a unit as recited in claim 1 wherein said electrically nonconductive material includes material properties for retaining spring force of the M-shaped springs.

8. The apparatus for removing a printed circuit board (PCB) and bezel assembly from a unit as recited in claim 1 wherein said pull spring is formed of a plastic material.

9. The apparatus for removing a printed circuit board (PCB) and bezel assembly from a unit as recited in claim 1 wherein said plastic material retains spring action while being compressed for an extended period of time.

10. The apparatus for removing a printed circuit board (PCB) and bezel assembly from a unit as recited in claim 1 wherein said pull spring is formed of a Polypropylene material.

11. The apparatus for removing a printed circuit board (PCB) and bezel assembly from a unit as recited in claim 1 wherein said pull spring is formed of an unreinforced, flame-retarded, Polypropylene material.

12. The apparatus for removing a printed circuit board (PCB) and bezel assembly from a unit as recited in claim 1 wherein said pull spring is an integral unit.

13. The apparatus for removing a printed circuit board (PCB) and bezel assembly from a unit as recited in claim 1 wherein said pull spring is a unitary member.

14. The apparatus for removing a printed circuit board (PCB) and bezel assembly from a unit as recited in claim 1 wherein said pull spring is formed by injection molding.

\* \* \* \* \*